(12) United States Patent
Hsu et al.

(10) Patent No.: US 12,238,864 B2
(45) Date of Patent: Feb. 25, 2025

(54) ELECTRONIC APPARATUS

(71) Applicant: Industrial Technology Research Institute, Hsinchu (TW)

(72) Inventors: Yu-Lin Hsu, Tainan (TW); Kuan-Chu Wu, Kaohsiung (TW); Ting-Yu Ke, Changhua County (TW); Min-Hsiung Liang, Hsinchu County (TW); Yu-Ming Peng, Taichung (TW)

(73) Assignee: Industrial Technology Research Institute, Hsinchu (TW)

( * ) Notice: Subject to any disclaimer, the term of this patent is extended or adjusted under 35 U.S.C. 154(b) by 281 days.

(21) Appl. No.: 17/702,814

(22) Filed: Mar. 24, 2022

(65) Prior Publication Data
US 2023/0199961 A1    Jun. 22, 2023

(30) Foreign Application Priority Data
Dec. 21, 2021    (TW) .................. 110147891

(51) Int. Cl.
| | | |
|---|---|---|
| H05K 1/11 | (2006.01) | |
| H01L 21/48 | (2006.01) | |
| H01L 23/13 | (2006.01) | |
| H01L 23/538 | (2006.01) | |
| H05K 3/00 | (2006.01) | |

(Continued)

(52) U.S. Cl.
CPC .......... *H05K 1/119* (2013.01); *H01L 21/4846* (2013.01); *H01L 23/13* (2013.01); *H01L 23/5386* (2013.01); *H05K 3/0014* (2013.01); *H01L 23/3121* (2013.01); *H05K 1/181* (2013.01); *H05K 2201/09018* (2013.01); *H05K 2201/09118* (2013.01)

(58) Field of Classification Search
CPC .......... H05K 1/02; H05K 1/0271; H05K 1/11; H05K 1/119; H05K 1/18; H05K 1/181; H05K 3/0014; H05K 2201/09018; H05K 2201/09118; H05K 2201/09045; H01L 23/13; H01L 23/3121; H01L 23/5385
USPC ................ 361/749, 767, 782–784, 792–795; 174/254–261
See application file for complete search history.

(56) References Cited

U.S. PATENT DOCUMENTS 4,946,733 A * 8/1990 Seeger, Jr. ............ H01L 23/145
                                                            428/209
2005/0030724 A1* 2/2005 Ryhanen .............. G01D 5/2405
                                                            361/760

(Continued)

FOREIGN PATENT DOCUMENTS

| CN | 109315069 | 2/2019 |
|---|---|---|
| CN | 109746444 | 5/2019 |
| TW | 486765 | 5/2002 |

OTHER PUBLICATIONS

"Office Action of Taiwan Counterpart Application", issued on May 18, 2022, p. 1–p. 6.

*Primary Examiner* — Tuan T Dinh
(74) *Attorney, Agent, or Firm* — JCIPRNET

(57) ABSTRACT

An electronic apparatus including a compression molding board and a connection pad is provided. The compression molding board has a device bonding area and a bending area formed by compression molding. The device bonding area is different from the bending area. The connection pad is disposed on the device bonding area of the compression molding board.

19 Claims, 8 Drawing Sheets

(51) Int. Cl.
    *H01L 23/31*    (2006.01)
    *H05K 1/18*    (2006.01)

(56) References Cited

U.S. PATENT DOCUMENTS

| | | | |
|---|---|---|---|
| 2010/0143648 A1* | 6/2010 | Tsai | B29C 45/14467 |
| | | | 264/263 |
| 2011/0291298 A1 | 12/2011 | Chumakov | |
| 2013/0242487 A1* | 9/2013 | Fujioka | B29C 70/46 |
| | | | 361/679.01 |
| 2013/0249740 A1* | 9/2013 | Shedletsky | H01Q 1/38 |
| | | | 174/254 |
| 2014/0218954 A1* | 8/2014 | Yoon | F21S 43/14 |
| | | | 362/546 |
| 2015/0001557 A1* | 1/2015 | Yoon | H05K 1/189 |
| | | | 438/27 |
| 2016/0120032 A1* | 4/2016 | Park | H01L 21/561 |
| | | | 361/748 |
| 2018/0160528 A1* | 6/2018 | Michiwaki | H05K 1/0284 |
| 2019/0035720 A1 | 1/2019 | Lai et al. | |
| 2021/0368627 A1* | 11/2021 | Smits | H05K 1/0393 |

\* cited by examiner

ELECTRONIC APPARATUS

CROSS-REFERENCE TO RELATED APPLICATION

This application claims the priority benefit of Taiwan application serial no. 110147891, filed on Dec. 21, 2021. The entirety of the above-mentioned patent application is hereby incorporated by reference herein and made a part of this specification.

BACKGROUND

Technical Field

The disclosure relates to an electronic apparatus, and also relates to an electronic apparatus with a compression molding board.

Description of Related Art

In a conventional in-mold electronics (IME) process, a chip is bonded to a flat board and then shaped. However, the process may have problems of stress matching, substrate deformation reliability, and/or low design degree of freedom.

SUMMARY

The disclosure provides an electronic apparatus including a compression molding board and a connection pad. The compression molding board has a device bonding area and a bending area formed by compression molding. The device bonding area is different from the bending area. The connection pad is disposed on the device bonding area of the compression molding board.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1A:
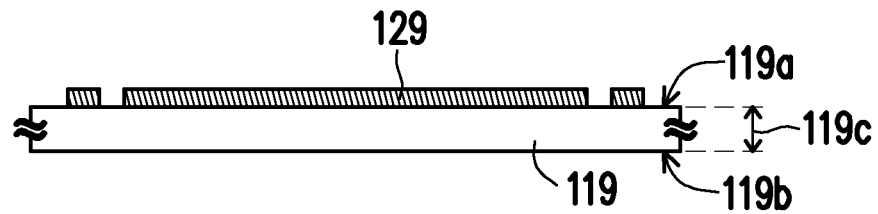
FIG. 1A to FIG. 1G are schematic partial cross-sectional views of part of a manufacturing method of an electronic apparatus according to a first embodiment of the disclosure.

The present disclosure will now be described more fully with reference to the accompanying drawings. However, the disclosure can be embodied in various forms, and is not limited to the embodiments provided below. The thickness of the layers and regions in the drawings is enlarged for clarity's sake. The same reference numbers are used in the drawings and the description to refer to the same or like parts, and description of the same parts are not repeated in following paragraphs.

The directional terms mentioned in the embodiments such as "up", "down" or other similar directional terms are for the purpose of describing directions in the figures only. Therefore, unless there are special instructions, the directional terms are used for description and are not intended to be limiting of the disclosure.

In order to clearly show the directional relationships between different figures, the Cartesian coordinate system (i.e., XYZ rectangular coordinate system) is used as an example to indicate the corresponding directions in some of the figures, but the disclosure is not limited thereto.

FIG. 1A to FIG. 1G are schematic partial cross-sectional views of part of a manufacturing method of an electronic apparatus according to a first embodiment of the disclosure. FIG. 1H and FIG. 1I are schematic partial three-dimensional views of an electronic apparatus according to the first embodiment of the disclosure. For example, FIG. 1H may be a schematic three-dimensional view corresponding to FIG. 1C or FIG. 1D. Namely, FIG. 1C may be a schematic partial cross-sectional view corresponding to a cross-section of FIG. 1F (for example, a cross-section parallel to an XZ plane); and/or, FIG. 1D may be a schematic partial cross-sectional view corresponding to a cross-section of FIG. 1F (for example, a cross-section parallel to a YZ plane). FIG. 1I may be a partial enlarged view of FIG. 1H. In addition, for clarity's sake, only a first surface 110a of a compression molding board 110 is illustrated in FIG. 1I and FIG. 1H, and a three-dimensional pattern of a corresponding curved surface or plane is represented by commonly used grid lines.

Referring to FIG. 1A, a substrate 119 is provided. A material of the substrate 119 may include a material suitable for compression molding. For example, the material of the substrate 119 may include polyethylene terephthalate (PET), polyethylene terephthalate glycol-modified (PETG), polyimide (PI), poly(methyl methacrylate) (PMMA), polyethersulfone (PES), polycarbonate (PC), polyethylene naphthalate (PEN), polydimethylsiloxane (PDMS), acrylic or a combination of the above materials, but the disclosure is not limited thereto.

In an embodiment, the substrate 119 may be a single material, but the disclosure is not limited thereto. In an embodiment, the substrate 119 may be a stack of multilayer films, sheets or thin boards.

In the embodiment, a thickness 119c of the substrate 119 may range from 0.1 mm to 2.3 mm. In this way, the substrate 119 may be more suitable for compression molding.

In the embodiment, the Young's modulus of the substrate 119 may be between 0.05 GPa and 5.9 GPa, but the disclosure is not limited thereto.

In the embodiment, a glass transition temperature (Tg) of the substrate 119 may be between 60° C. and 350° C., but the disclosure is not limited thereto.

In the embodiment, a coefficient of thermal expansion (CTE) of the substrate 119 may range from 5 ppm/° C. to 500 ppm/° C., but the disclosure is not limited thereto.

In the embodiment, the substrate 119 may have a conductive layer 129 on one surface. A material of the conductive layer 129 may include gold, silver, copper, indium, tin, zinc, alloys of the above metals, oxides of the above metals, and/or a combination of the above materials. For example, the substrate 119 has a first surface 119a and a second surface 119b opposite to the first surface 119a. The conductive layer 129 may be formed on the first surface 119a of the substrate 119 by sputtering, deposition, electroplating, screen printing, ink-jet printing, other suitable methods, or a combination of the above methods. The conductive layer 129 may be a single film layer or a stack of multiple film layers, which is not limited by the disclosure.

In addition, the conductive layer 129 may have an appropriate pattern according to an actual design requirement. The disclosure does not limit the pattern of the conductive layer 129. A partial pattern of the conductive layer 129 may be referred to as a circuit layout. For example, in subsequent applications, a part of the conductive layer 129 may be used as a connection pad (such as a connection pad 122 described later, but the disclosure is not limited thereto), and/or a part of the conductive layer 129 may be used as a wire (such as: a wire 123 described later, but the disclosure is not limited thereto).

In a similar or unillustrated embodiment, the second surface 119b of the substrate 119 may have a conductive layer that is the same as or similar to the conductive layer 129.

In an embodiment, the first surface 119a and the second surface 119b are substantially parallel. Namely, the thickness 119c of the substrate 119 is substantially consistent.

Figure 1B:
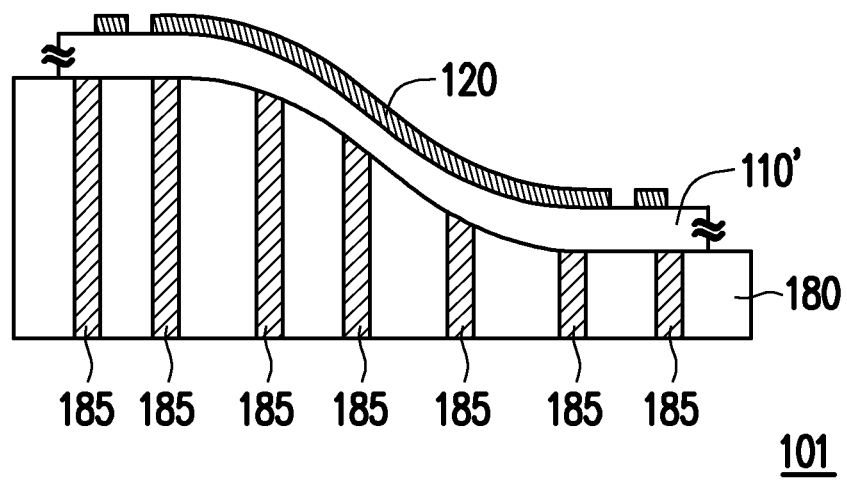

Referring to FIG. 1A to FIG. 1B, by means of compression molding, at least a part of the substrate 119 (shown in FIG. 1A) is bent to form a corresponding compression molding board 110' (shown in FIG. 1B). A method of the compression molding may include a commonly used heat pressing technique, a vacuum-assisted pressing technique, and/or a combination of the above techniques.

Figure 1C:
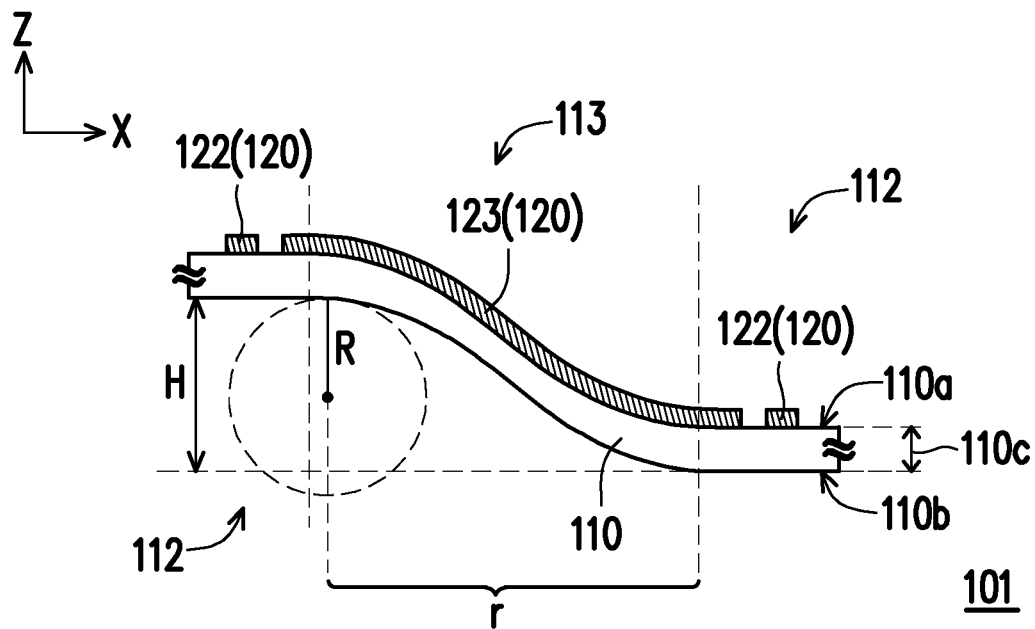
Figure 1D:
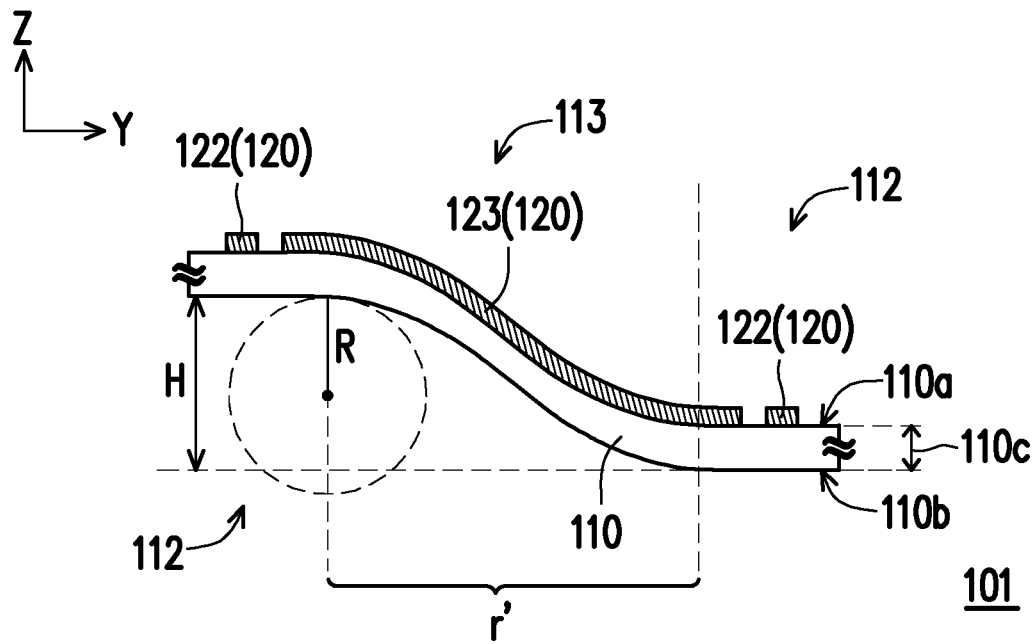
Figure 1E:
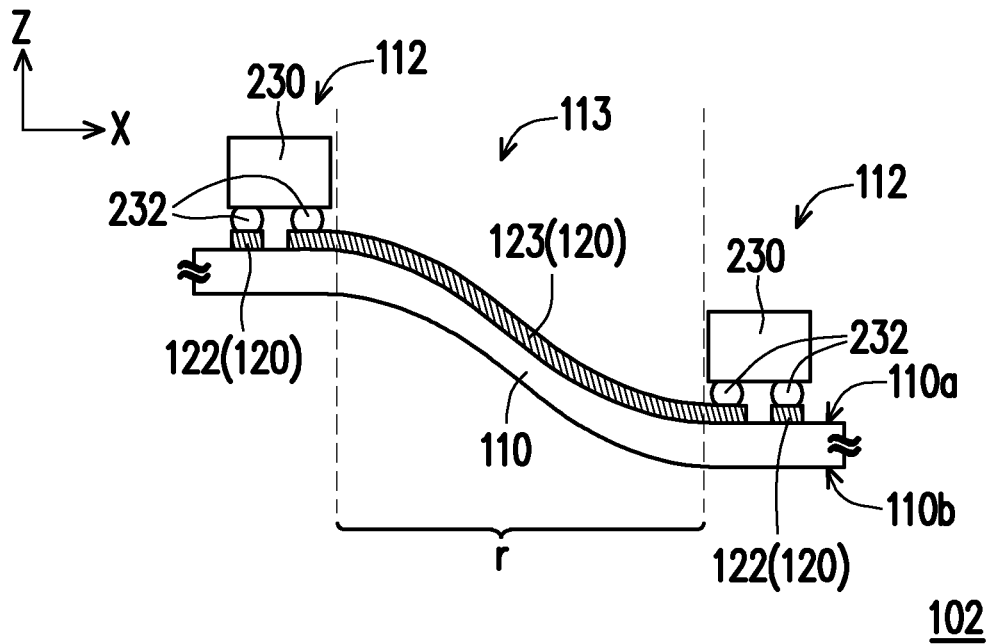
Figure 1F:
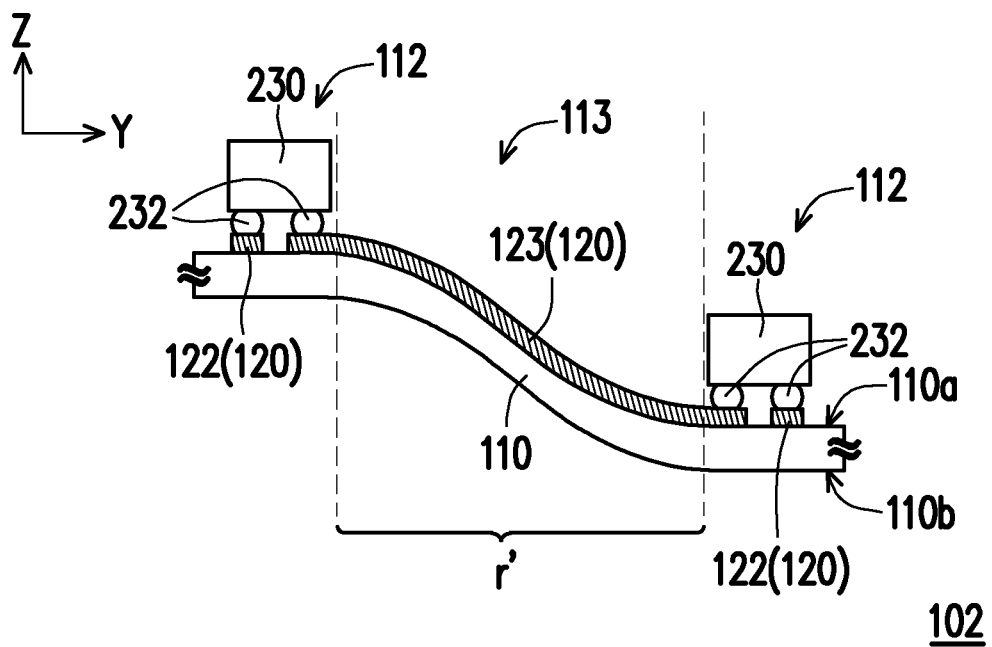

For example, the substrate 119 may be first placed on a mold 180. An appearance of the mold 180 at a place suitable for placing the substrate 119 may have a corresponding protrusion and/or depression. In addition, the substrate 119 placed on the mold 180 may be softened by an appropriate heating method (such as hot air heating, infrared light heating, other suitable heating methods or a combination of the above methods) to form a curved substrate 110'. Then, the air is evacuated from air extraction ports 185 of the mold 180. A pressure exerted on the softened substrate 119 placed on the mold 180 during air extraction may be referred to as a molding pressure. In this way, the softened substrate 110' may be bent and have a shape corresponding to the appearance of the mold, and the conductive layer 120 located on the softened substrate 110' may be at least partially bent. Then, the bent substrate 110' is separated from the mold 180 to form the compression molding board 110 as shown in FIG. 1C, FIG. 1D, FIG. 1H, and/or FIG. 1I. It should be noted that the above method is only an exemplary demonstration, and the disclosure is not limited thereto.

The compression molding method is basically to form a corresponding object (such as the substrate 119) with an appearance (such as the appearance of the compression molding board 110) of an appropriate shape/curvature through the above-mentioned physical method. Therefore, regarding the substrate 119 subjected to the compression molding and/or the compression molded substrate 110', the material or thickness thereof is basically not changed much or significantly. For example, in the compression molding board 110, in a normal direction of a part of the bent first surface 110a or a part of the bent second surface 110b, a distance between the first surface 110a and the second surface 110b (i.e., a thickness 110c of the compression molding board 110) is substantially between 0.1 mm and 2.3 mm.

In an embodiment, the first surface 110a and the second surface 110b are substantially parallel. In other words, the thickness 110c of the compression molding board 110 is substantially consistent.

In an embodiment, the compression molding method may also include a pressing method by using a positive mold and a negative mold corresponding to the positive mold.

Referring to FIG. 1C, FIG. 1D, FIG. 1H and/or FIG. 1I, since the compression molding board 110 and at least a part of the conductive layer 120 (such as the connection pad 122) located on one surface thereof (such as the first surface 110a) may already have proper effects, an electronic apparatus 101 is constructed. For example, the compression molding board 110 may have a device bonding area 112 and a bending area 113 formed by compression molding. The device bonding area 112 is far away from the bending area 113, i.e., the device bonding area 112 and the bending area 113 are different areas. The conductive layer 120 may include a connection pad 122 or a wire 123. A part of the conductive layer 120 serving as the connection pad 122 may be located on the device bonding area 112 of the compression molding board 110. A part of the conductive layer 120 serving as the wire 123 may extend from the device bonding area 112 of the compression molding board 110 to the bending area 113.

In an embodiment, other electronic devices (such as an electronic device 230 to be described later, but the disclosure is not limited thereto) are adapted to be configured (for example, through welding) on the connection pad 122 disposed on the device bonding area 112 of the compression molding board 110.

During the process of compression molding, due to an internal stress, it is possible (but not limited to) that the compression molding board 110 has a corresponding wrinkle 115. Taking FIG. 1H or FIG. 1I as an example, viewed from a top view direction (such as a direction perpendicular to the XY plane, such as a −Z direction), the compression molding board 110 may basically bend outward from the maximum displacement D of the compression molding (i.e., the maximum displacement in the Z direction during the compression molding process, which may be a point or a surface) and bend in a direction opposite to the displacement (for example, a direction of the displacement is the Z direction). Taking a mold with a protrusion that is the same as a sphere or a quasi-sphere (such as hemisphere, quarter sphere, ellipsoid, semi-ellipsoid, quarter ellipsoid, or other similar shapes) as an example, when viewed from the above-mentioned top-view direction, the outward direction may correspond to a radial direction of the sphere or quasi-sphere. When viewed from the above-mentioned top-view direction, if a place or an area of the bending area 113 of the compression molding board 110 is in a direction perpendicular to the above-mentioned radial direction, this place or area is a local maximum, and a height (for example, a displacement in the Z direction) of the place or the area is greater than a height of another place or area adjacent to the place or the area in the direction perpendicular to the radial direction by about 200 micrometers (μm) or more (i.e., a height difference of the wrinkle 115 to be described later is greater than or equal to about 200 μm), and this place or area and its adjacent place or adjacent area along the radial direction may be regarded as the wrinkle 115.

In an embodiment, if the quantity of the wrinkles 115 is relatively small (for example, less than 6) and the height difference of the wrinkles 115 is relatively small (for example, the height difference is less than or equal to 30% of the thickness 110c of the compression molding board 110), the electronic device 101 may have better quality and/or better applicability. Namely, if the quantity of the wrinkles 115 is too large (for example, greater than or equal to 6) and/or the height difference of the wrinkles 115 is too large (for example, the height difference is greater than 30% of the thickness 110c of the compression molding board 110), the performance of the electronic apparatus 101 is probably affected. Taking the compression molding board 110 with the thickness 110c of 2.3 mm as an example, if the number of the wrinkles 115 is greater than or equal to 6 and/or the height difference of the wrinkles 115 is greater than about 700 μm, it may be difficult for other electronic devices to be placed on the connection pads 122, and/or the conductive layer 120 is easier to be peeled off; and/or, after the subsequent molding step, the stress of the compression molding board 110 is uneven due to that the quantity of the wrinkles 115 is too large and/or the height difference of the wrinkles 115 is too large, which makes the electronic apparatus 101 or similar electronic apparatus/electronic apparatus including the same more likely to be damaged or have low performance.

In an embodiment, a radius of curvature of the bending area 113 is R, an arch height of the bending area 113 is H, and the radius of curvature of the bending area 113 and the arch height of the bending area 113 have a following relationship: H/R<0.64. In this way, the electronic apparatus 101 may have better quality. Preferably, the radius of curvature of the bending area 113 and the arch height of the bending area 113 may have a following relationship: H/R<0.24.

Under tests or simulations of different molding pressures (corresponding to the molding pressure) and/or thicknesses (corresponding to the thickness 110c or thickness 119c), the arch heights/radius of curvatures and the wrinkle quantities may be as shown in a following [Table 1]. The aforementioned or subsequent simulations may be performed by general commercial engineering simulation software (such as ANSYS, but the disclosure is not limited thereto).

TABLE 1

| arch height/radius of curvature (H/R) | Molding pressure (MPa) | Thickness (mm) | >250 μm Wrinkle number |
|---|---|---|---|
| 1 | 0.085 | 0.23 | 6 |
| 1 | 0.2 | 0.23 | 4 |
| 1 | 0.5 | 0.23 | 2 |
| 1 | 0.8 | 0.23 | 0 |
| 1 | 0.085 | 0.23 | 6 |
| 1 | 0.085 | 0.35 | 2 |
| 1 | 0.085 | 0.58 | 0 |
| 1 | 0.085 | 1.15 | 0 |
| 0.4 | 0.085 | 0.23 | 1 |
| 0.4 | 0.1 | 0.23 | 1 |
| 0.4 | 0.2 | 0.23 | 0 |
| 0.4 | 0.5 | 0.23 | 0 |
| 0.4 | 0.085 | 0.23 | 1 |
| 0.4 | 0.085 | 0.58 | 1 |
| 0.4 | 0.085 | 1.15 | 0 |
| 0.4 | 0.085 | 2.3 | 0 |
| 0.2 | 0.085 | 0.23 | 0 |

In an exemplary embodiment, if a ratio of the arch height of the bending area 113 to the radius of curvature of the bending area 113 is less than 0.64 (i.e., H/R<0.64), when the thickness ranges from 0.23 mm to 2.3 mm, and the molding pressure ranges from 0.085 MPa to 0.8 MPa, the electronic apparatus 101 may have better quality and/or better applicability.

In an exemplary embodiment, if the range of the thickness is greater than 0.47 mm, when the ratio of the arch height of the bending area 113 to the radius of curvature of the bending area 113 is between 0.2-1 (i.e., 0.2≤H/R≤1), and the molding pressure ranges from 0.085 MPa to 0.8 MPa, the electronic apparatus 101 may have better quality and/or better applicability.

In an exemplary embodiment, if the molding pressure is greater than 0.54 MPa, when the thickness ranges from 0.23 mm to 2.3 mm, and the ratio of the arch height of the bending area 113 to the radius of curvature of the bending area 113 is between 0.2-1 (i.e., 0.2≤H/R≤1), the electronic apparatus 101 may have better quality and/or better applicability In this embodiment, a shape of the compression molding is not limited to be a symmetrical geometric pattern. For example, as shown in FIG. 1C or FIG. 1E, in a direction (for example, the X direction), a compression molding radius of the bending area 113 is r; as shown in FIG. 1D or FIG. 1F, in another direction (for example, the Y direction), a compression molding radius of the bending area 113 is r'; and the embodiment does not limit the compression molding radius r in one direction (such as the X direction) to be the same or different from the compression molding radius r' in another direction (such as the Y direction). If the compression molding radius r is the same or close to the compression molding radius r', the shape of the compression molding may be the same or close to a circle. If the compression molding radius r is different from the compression molding radius r', the shape of the compression molding may be the same or close to an ellipse.

Moreover, for the sake of simplicity, in the following description, the compression molding radius r in one direction (such as the X direction) is described in detail. Those of ordinary skills in the art to which the disclosure belongs may reasonably derive the technology related to the compression molding radius r to the compression molding radius r' in another direction (such as the Y direction) with the same understandable meaning.

In an embodiment, the compression molding radius of the bending area 113 is r; in a first direction, a first size between a molding midpoint P of the bending area 113 and an edge E of the compression molding board 110 is W. In a second direction perpendicular to the first direction, a second size between the molding midpoint P of the bending area 113 and the edge E of the compression molding board 110 is L. In addition, the compression molding radius, the first size, and the second size have a following relationship: $W \times L / r^2 > 19$. In this way, the electronic apparatus 101 may have better quality.

In an embodiment, a relationship value of the compression molding radius, the first size and the second size (i.e., $W \times L / r^2$) may be greater than 31.6 (i.e., $W \times L / r^2 > 31.6$).

Under tests or simulations of different relationship values of the compression molding radius, the first size and the second size (i.e., $W \times L / r^2$) and the arch height/radius of curvature R (i.e., H/R), the corresponding wrinkle number and the maximum wrinkle height difference may be as shown in a following [Table 2].

TABLE 2

| Relationship value of compression molding radius, first size and second size (i.e., W × L/r²) | Arch height/radius of curvature (i.e., H/R) | Wrinkle number | Maximum wrinkle height difference (μm) |
| --- | --- | --- | --- |
| 12.1 | 1 | 6 | 550 |
| 19.0 | 0.4 | 1 | 727 |
| 33.8 | 0.2 | 0 | 0 |

In an exemplary embodiment, if the relationship value of the compression molding radius, the first size and the second size (i.e., W×L/r²) is greater than 19 (i.e., W×L/r²>19), the wrinkle number may be 1 or less.

In an exemplary embodiment, if the relationship value of the compression molding radius, the first size and the second size (i.e., W×L/r²) is greater than 31.6 (i.e., W×L/r²>31.6), the wrinkle number may be 1 or less, and the maximum wrinkle height difference may be equal to 200 μm; or, the height difference may be less than 200 μm without being regarded as a wrinkle.

In an embodiment, the compression molding radius and the first size have a following relationship: W/r>3.7; and/or, the compression molding radius and the second size have a following relationship: L/r>3.7. In this way, the electronic apparatus 101 may have better quality.

Under tests or simulations of different relationship values of the compression molding radius and the first size (i.e., W/r) and relationship values of the compression molding radius and the second size (i.e., L/r), the corresponding wrinkle number and the maximum wrinkle height difference may be as shown in a following [Table 3].

TABLE 3

| Relationship value of compression molding radius and first size (i.e. W/r) | Relationship value of compression molding radius and second size (i.e. L/r) | Arch height/radius of curvature (H/R) | Wrinkle number | Maximum wrinkle height difference (μm) |
| --- | --- | --- | --- | --- |
| 2.9 | 4.2 | 1 | 6 | 550 |
| 3.625 | 5.25 | 0.4 | 1 | 727 |
| 4.833 | 7 | 0.2 | 0 | 0 |

In an exemplary embodiment, if the relationship value of the compression molding radius and the first size (i.e., W/r) is greater than 3.7 (i.e., W/r>3.7), the relationship value of the compression molding radius and the second size (i.e., L/r) is greater than 3.7 (i.e., L/r>3.7), and a ratio of the arch height of the bending area 113 to the radius of curvature of the bending area 113 is less than 0.64 (i.e., H/R<0.64), the wrinkle number may be 1 or less.

In an exemplary embodiment, if the relationship value of the compression molding radius and the first size (i.e., W/r) is greater than 4.9 (i.e., W/r>4.9), the relationship value of the compression molding radius and the second size (i.e., L/r) is greater than 4.9 (i.e., L/r>4.9), and the ratio of the arch height of the bending area 113 to the radius of curvature of the bending area 113 is less than 0.64 (i.e., H/R<0.64), the wrinkle number may be 1 or less, and the maximum wrinkle height difference may be approximately equal to 200 μm; or, the height difference may be less than 200 μm without being regarded as a wrinkle.

In an embodiment, through the above method, the radius of curvature R of the bending area 113 of the compression molding board 110 may be less than 100 mm. In addition, the electronic apparatus 101 having the compression molding board 110 with the radius of curvature may still have better quality. For example, the radius of curvature R of the bending area 113 of the compression molding board 110 may be between 5 mm and 100 mm.

In an embodiment, the bending area 113 of the compression molding board 110 may not have the same or similar connection pads as the connection pads 122 (not drawn or indicated due to no connection pad).

Referring to FIG. 1C/FIG. 1D to FIG. 1E/FIG. 1F, in an embodiment, the electronic device 230 may be disposed on the connection pad 122, and the electronic device 230 may be electrically connected to the connection pad 122. The electronic device 230 may include a chip, a chip package or other suitable electronic devices, which is not limited by the disclosure.

In an embodiment, the electronic device 230 may be electrically connected to the connection pad 122 through conductive terminals 232. The conductive terminals 232 may include solder balls, but the disclosure is not limited thereto.

In the embodiment, since the compression molding board 110, the connection pad 122 (i.e., a part of the conductive layer 120) disposed on the compression molding board 110, and the electronic device 230 on the connection pad 122 may already have proper effects, an electronic apparatus 102 may be constructed. In other words, the electronic apparatus 102 may include the compression molding board 110, the connection pad 122 and the electronic device 230.

Moreover, during a process of or after disposing the electronic device 230 on the connection pad 122, there is basically no substantial change in the structure or state between the compression molding board 110 or other components. Therefore, regarding the compression molding board 110 included in the electronic apparatus 101, the corresponding content thereof must or may refer to the drawings (such as FIG. 1C, FIG. 1D, FIG. 1H, and FIG. 1I; but the disclosure is not limited thereto) and the corresponding descriptions.

Figure 1G:
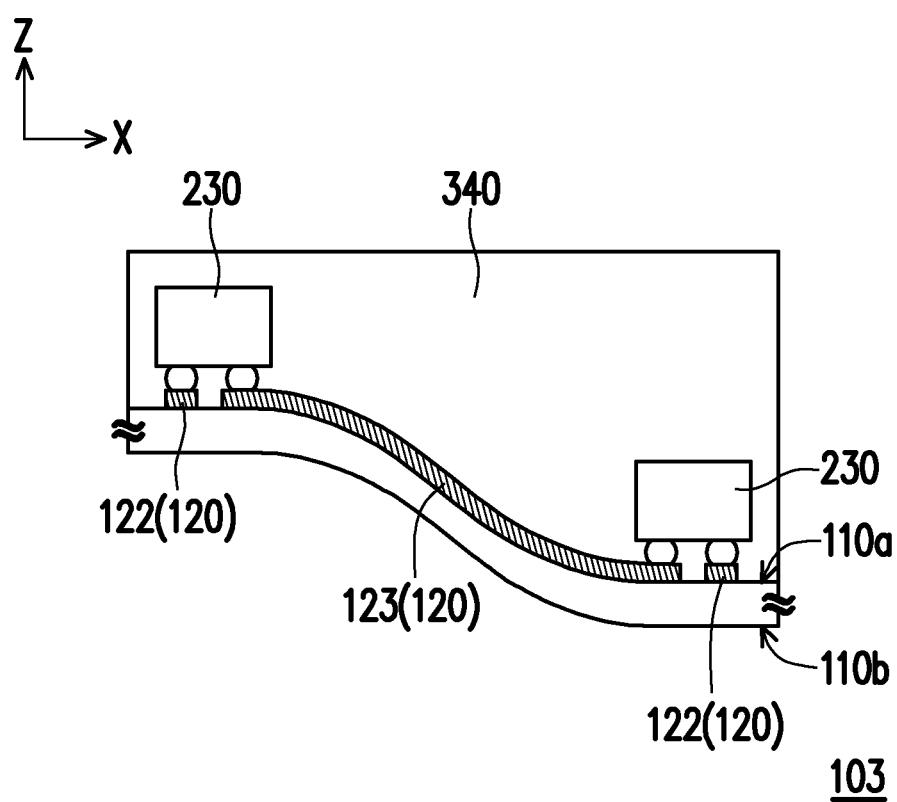
Figure 1H:
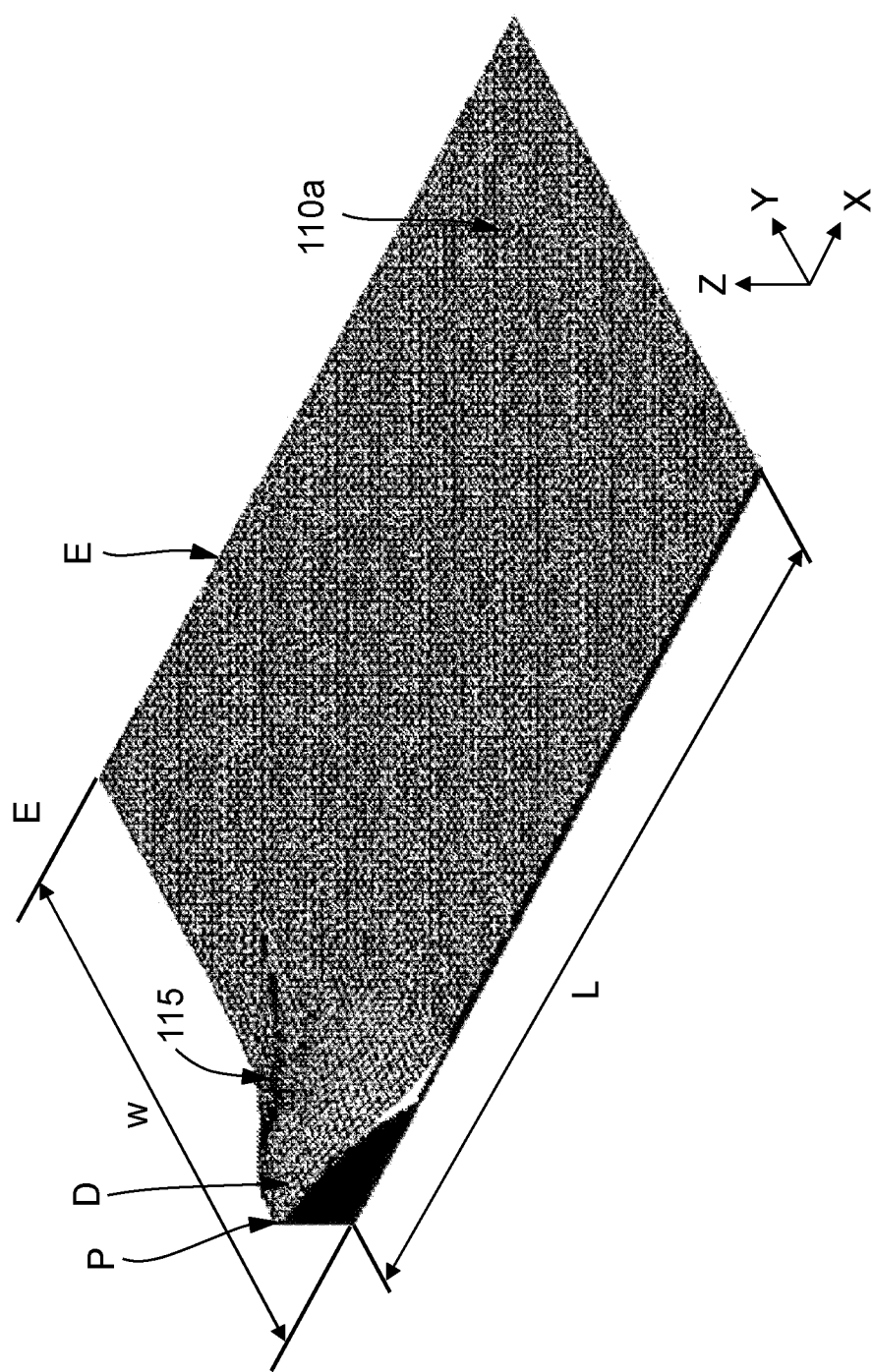
FIG. 1H and FIG. 1I are schematic partial three-dimensional views of an electronic apparatus according to the first embodiment of the disclosure.
Figure 1I:
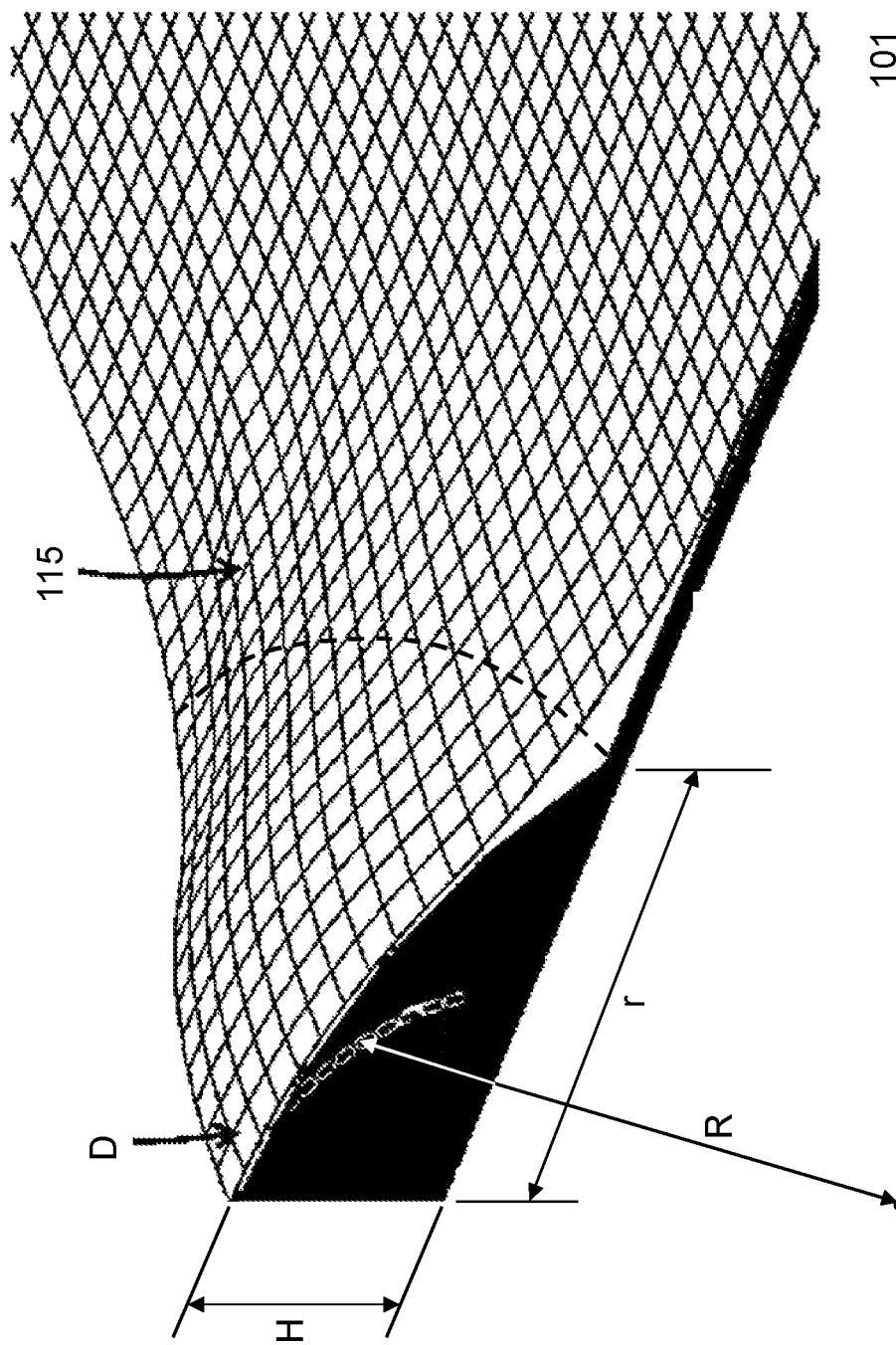

Referring to FIG. 1E to FIG. 1G, in an embodiment, after the electronic device 230 is disposed on the connection pad 122, an encapsulating layer 340 encapsulating the electronic device 230 may be formed on the compression molding board 110. A material or formation method of the encapsulating layer 340 may be selected adaptively according to the electronic device 230 or other possible conditions, which is not limited by the disclosure. Taking the electronic device 230 including a chip as an example, the material of the encapsulating layer 340 may include epoxy resin or other suitable molding materials. Taking the electronic device 230 including a light-emitting diode as an example, the material of the encapsulating layer 340 may include optical clear adhesive (OCA) or other suitable light-transmitting materials.

In the embodiment, since the compression molding board 110, the connection pad 122 (i.e., a part of the conductive layer 120) disposed on the compression molding board 110, the electronic device 230 on the connection pad 122 and the encapsulating layer 340 encapsulating the electronic device 230 may already have proper effects, an electronic apparatus 103 may be constructed. In other words, the electronic apparatus 103 may include the compression molding board 110, the connection pad 122 and the electronic device 230 and the encapsulating layer 340.

In addition, during a process of or after forming the encapsulating layer 340, there is basically no substantial change in the structure or state between the compression molding board 110 or other components. Therefore, regarding the compression molding board 110 included in the electronic apparatus 103, the corresponding content thereof must or may refer to the drawings (such as FIG. 1C, FIG. 1D, FIG. 1H, and FIG. 1I; but the disclosure is not limited thereto) and the corresponding descriptions. Similarly, during the process of or after forming the encapsulating layer 340, there is basically no substantial change in the structure or state between the electronic device 230 or other components. Therefore, regarding the electronic device 230 included in the electronic apparatus 103, the corresponding content thereof must or may refer to the drawings (such as FIG. 1G, but the disclosure is not limited thereto) and the corresponding descriptions.

Based on the above description, by using the compression molding board 110, the electronic apparatus 101, 102, or 103 including the same may have better quality and/or better applicability.

Figure 2:
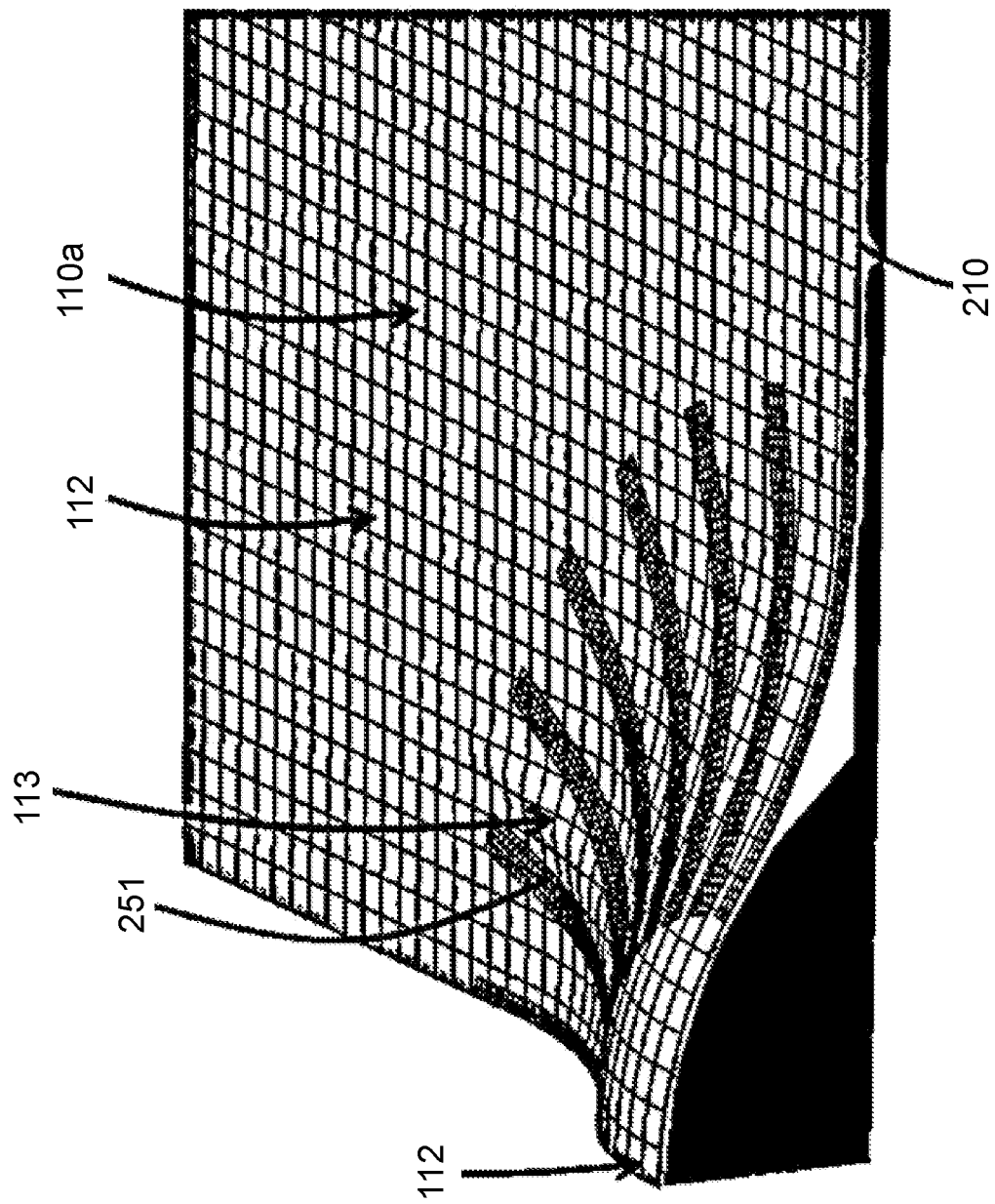
FIG. 2 is a schematic partial three-dimensional view of an electronic apparatus according to a second embodiment of the disclosure.

FIG. 2 is a schematic partial three-dimensional view of a partial manufacturing method of an electronic apparatus according to a second embodiment of the disclosure.

Referring to FIG. 2, an electronic apparatus 201 of the embodiment may be similar to the electronic apparatus 101 of the previous embodiment, and the similar sizes, orientations, and components thereof are represented by the same referential numerals, and have corresponding patterns, and descriptions thereof are omitted. For example, for clarity's sake, only a compression molding board 210 is shown in FIG. 2, and the first surface 110a of the compression molding board 210 is represented by commonly used grid lines to indicate a three-dimensional pattern of the corresponding curved surface or plane. In other words, the electronic apparatus 201 may include the compression molding board 210 and the connection pad (not shown directly, which is the same or similar to the connection pad 122 of the previous embodiment, i.e., a part of the conductive of layer 120) disposed on the device bonding area 112 of the compression molding board 210.

A material or formation method of the compression molding board 210 of the embodiment may be similar to the compression molding board 110 of the previous embodiment with a difference that the compression molding board 210 has at least one stress compensation structure 251.

In the embodiment, the stress compensation structure 251 may include at least one protrusion, and the protrusion is, for example, a strip-shaped protrusion, a cone-shaped protrusion, an arc-shaped protrusion, etc., but the disclosure is not limited thereto. The arrangement of the protrusions may include radial arrangement, symmetric arrangement or asymmetric arrangement. A thickness of the protruded stress compensation structure 251 may be between 0.4 μm and 1 μm, but the disclosure is not limited thereto.

In an embodiment, the stress compensation structure 251 may be a structure disposed on the first surface 110a of the compression molding board 210, and a material of the stress compensation structure 251 may be the same or similar to that of the compression molding board 210, but the disclosure is not limited thereto. For example, a strip-shaped film, a sheet or a thin plate may be connected to a board or a substrate to form the stress compensation structure 251.

In an embodiment, the number of the stress compensation structures 251 may be plural, and the plurality of stress compensation structures 251 are separated from each other. For example, the number of the stress compensation structures 251 may be six.

In an embodiment, the stress compensation structures 251 are basically located in the bending area 113.

In an embodiment, when the compression molding is performed to form the compression molding board 210, a corresponding stress (including external stress or internal stress) is exerted on the compression molding board 210 (or a board used for forming the same). The stress compensation structure 251 on the compression molding board 210 (or the board used for forming the same) may probably cause a boundary or a line of discontinuity/surface of discontinuity of stress propagation. In this way, the quantity of the wrinkles and/or the height of the wrinkles may be reduced, and the compression molding board 210 or the electronic apparatus 201 including the same may have better quality and/or better applicability.

In an embodiment, the stress compensation structure 251 may probably increase the stress that the bending area 113 of the compression molding board 210 may withstand.

In an embodiment, electronic devices may be disposed on the device bonding area 112 of the compression molding board 210. In this way, an electronic apparatus that is the same or similar to the electronic apparatus 102 may be constructed.

In an embodiment, an encapsulating layer (which may be, for example, the same as or similar to the encapsulating layer 340 described above) may be formed on the compression molding board 210. In this way, an electronic apparatus that is the same or similar to the electronic apparatus 103 may be constructed.

Figure 3:
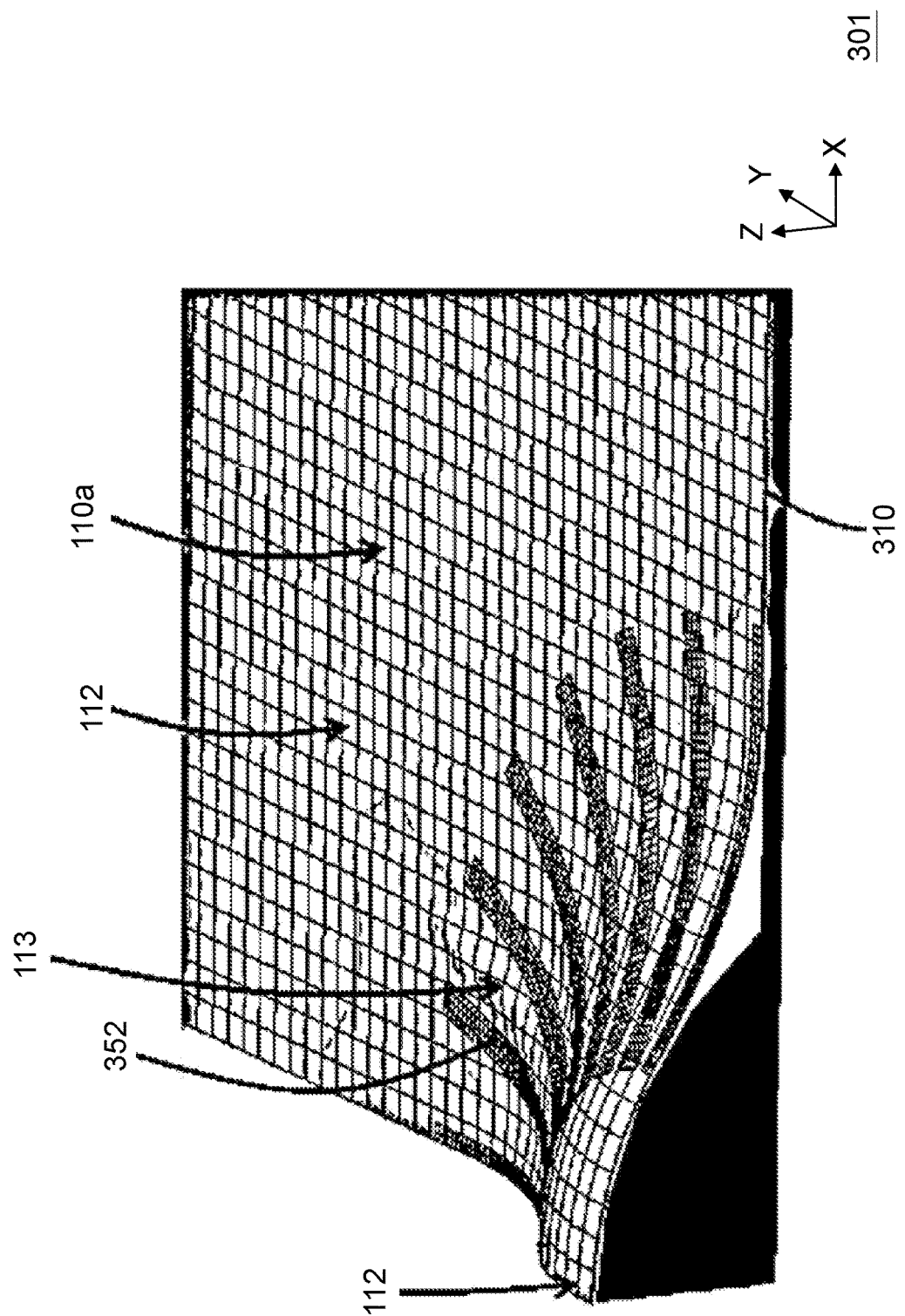
FIG. 3 is a schematic partial three-dimensional view of an electronic apparatus according to a third embodiment of the disclosure.

FIG. 3 is a schematic partial three-dimensional view of a part of a manufacturing method of an electronic apparatus according to a third embodiment of the disclosure.

Referring to FIG. 3, an electronic apparatus 301 of the embodiment may be similar to the electronic apparatus 101 of the previous embodiment, and the similar sizes, orientations, and components thereof are represented by the same referential numerals, and have corresponding patterns, and descriptions thereof are omitted. For example, for clarity's sake, only a compression molding board 310 is shown in FIG. 3, and the first surface 110a of the compression molding board 310 is represented by commonly used grid lines to indicate a three-dimensional pattern of the corresponding curved surface or plane. In other words, the electronic apparatus 301 may include the compression molding board 310 and the connection pad (not shown directly, which is the same or similar to the connection pad 122 of the previous embodiment, i.e., a part of the conductive of layer 120) disposed on the device bonding area 112 of the compression molding board 310.

A material or formation method of the compression molding board 310 of the embodiment may be similar to the compression molding board 110 of the previous embodiment with a difference that the compression molding board 310 has at least one stress compensation structure 352.

In the embodiment, the stress compensation structure 352 may include at least one opening, and the opening may be, for example, a strip-shaped opening, a cone-shaped opening, an arc-shaped opening, etc., but the disclosure is not limited thereto. The arrangement of the openings may include radial arrangement, symmetric arrangement or asymmetric arrangement. In an embodiment, the strip-shaped openings may be formed through cutting, punching or other suitable methods.

In an embodiment, the number of the stress compensation structures 352 may be plural, and the plurality of stress compensation structures 352 are separated from each other. For example, the number of the stress compensation structures 352 may be six.

In an embodiment, the stress compensation structures 352 are basically located in the bending area 113.

In an embodiment, when the compression molding is performed to form the compression molding board 310, a corresponding stress (including external stress or internal stress) is exerted on the compression molding board 310 (or a board used for forming the same). The stress compensation structure 352 on the compression molding board 310 (or the board used for forming the same) may probably cause a boundary or a line of discontinuity/surface of discontinuity of stress propagation. In this way, the quantity of the wrinkles and/or the height of the wrinkles may be reduced, and the compression molding board 310 or the electronic apparatus 301 including the same may have better quality and/or better applicability.

In an embodiment, electronic devices may be disposed on the device bonding area 112 of the compression molding board 310. In this way, an electronic apparatus that is the same or similar to the electronic apparatus 102 may be constructed.

In an embodiment, an encapsulating layer (which may be, for example, the same as or similar to the encapsulating layer 340 described above) may be formed on the compression molding board 310. In this way, an electronic apparatus that is the same or similar to the electronic apparatus 103 may be constructed.

In summary, the electronic apparatuses of the embodiments of the disclosure may have better quality and/or better applicability.

It will be apparent to those skilled in the art that various modifications and variations may be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. An electronic apparatus, comprising:
   a compression molding board, having a device bonding area and a bending area formed by compression molding, wherein the device bonding area is different from the bending area; and
   a connection pad, disposed on the device bonding area of the compression molding board, wherein:
      a compression molding radius of the bending area is r;
      in a first direction, a first size between a molding midpoint of the bending area and an edge of the compression molding board is W;
      in a second direction perpendicular to the first direction, a second size between the molding midpoint of the bending area and the edge of the compression molding board is L; and
      the compression molding radius, the first size, and the second size have a following relationship: $W \times L/r^2 > 19$.

2. The electronic apparatus as claimed in claim 1, wherein the compression molding radius, the first size and the second size further have a following relationship:
   $W \times L/r^2 > 31.6$.

3. An electronic apparatus, comprising:
   a compression molding board, having a device bonding area and a bending area formed by compression molding, wherein the device bonding area is different from the bending area; and
   a connection pad, disposed on the device bonding area of the compression molding board, wherein:
      a compression molding radius of the bending area is r;
      in a first direction, a first size between a molding midpoint of the bending area and an edge of the compression molding board is W;
      in a second direction perpendicular to the first direction, a second size between the molding midpoint of the bending area and the edge of the compression molding board is L; and
      the compression molding radius, the first size, and the second size have a following relationship: $W/r > 3.7$ and $L/r > 3.7$.

4. The electronic apparatus as claimed in claim 3, wherein a radius of curvature of the bending area is less than 100 mm.

5. The electronic apparatus as claimed in claim 3, wherein a radius of curvature of the bending area is R, an arch height of the bending area is H, and the radius of curvature of the bending area and the arch height of the bending area have a following relationship: $H/R < 0.64$.

6. The electronic apparatus as claimed in claim 3, wherein a radius of curvature of the bending area is R, an arch height of the bending area is H, and the radius of curvature of the bending area and the arch height of the bending area have a following relationship: $H/R < 0.24$.

7. The electronic apparatus as claimed in claim 3, wherein a material of the compression molding board comprises polyethylene terephthalate (PET), polyethylene terephthalate glycol-modified (PETG), polyimide (PI), poly (methyl methacrylate) (PMMA), polyethersulfone (PES), polycarbonate (PC), polyethylene naphthalate (PEN), polydimethylsiloxane (PDMS), acrylic or a combination thereof.

8. The electronic apparatus as claimed in claim 3, wherein a thickness of the compression molding board is between 0.1 mm and 2.3 mm.

9. The electronic apparatus as claimed in claim 3, wherein the compression molding board is formed by a compression molding step, and a molding pressure of the compression molding step is within a range of 0.085 MPa to 0.8 MPa.

10. The electronic apparatus as claimed in claim 3, wherein the compression molding board has at least one wrinkle.

11. The electronic apparatus as claimed in claim 3, wherein the compression molding board has at least one stress compensation structure.

12. The electronic apparatus as claimed in claim 3, further comprising:
   an electronic device, disposed on the connection pad and electrically connected to the connection pad.

13. The electronic apparatus as claimed in claim 10, wherein a wrinkle height difference is greater than or equal to about 200 μm and less than or equal to 30% of a thickness of the compression molding board.

14. The electronic apparatus as claimed in claim 10, wherein a number of the wrinkles is less than 6.

15. The electronic apparatus as claimed in claim 11, wherein a number of the at least one stress compensation structure is plural.

16. The electronic apparatus as claimed in claim 11, wherein the at least one stress compensation structure comprises a protrusion.

17. The electronic apparatus as claimed in claim 11, wherein the at least one stress compensation structure comprises an opening.

18. The electronic apparatus as claimed in claim 12, further comprising:
   an encapsulating layer, disposed on the compression molding board and encapsulating the electronic device.

19. The electronic apparatus as claimed in claim 15, wherein the stress compensation structures are separated from each other.

* * * * *